US012593619B1

(12) United States Patent
    Pan

(10) Patent No.: US 12,593,619 B1
(45) Date of Patent: Mar. 31, 2026

(54) SYSTEM AND METHOD FOR ELECTRONIC DEVICES

(71) Applicant: National Technology & Engineering Solutions of Sandia, LLC, Albuquerque, NM (US)

(72) Inventor: Wei Pan, San Ramon, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 401 days.

(21) Appl. No.: 18/136,508

(22) Filed: Apr. 19, 2023

(51) Int. Cl.
    *H10N 60/10*       (2023.01)
    *H03K 19/20*      (2006.01)
    *H10N 60/01*       (2023.01)
    *H10N 60/12*       (2023.01)
    *H10N 60/85*       (2023.01)

(52) U.S. Cl.
    CPC ....... *H10N 60/128* (2023.02); *H10N 60/0912* (2023.02); *H10N 60/12* (2023.02); *H10N 60/85* (2023.02); *H03K 19/20* (2013.01)

(58) Field of Classification Search
    CPC .................................................. H10N 60/128
    See application file for complete search history.

(56) References Cited

U.S. PATENT DOCUMENTS

| | | | |
|---|---|---|---|
| 5,071,832 | A | 12/1991 | Iwamatsu |
| 5,239,187 | A | 8/1993 | Schuhl et al. |
| 5,447,883 | A | 9/1995 | Koyama |
| 10,573,800 | B1 | 2/2020 | Najafi |
| 11,380,731 | B1 | 7/2022 | Najafi |
| 2011/0254053 | A1 | 10/2011 | Goupil et al. |

FOREIGN PATENT DOCUMENTS

| | | | |
|---|---|---|---|
| JP | H06260691 | * | 9/1994 |
| JP | 61171179 | * | 8/1998 |

* cited by examiner

*Primary Examiner* — Matthew L Reames
(74) *Attorney, Agent, or Firm* — Calfee, Halter & Griswold LLP; Samantha Updegraff; Mario A. Burgarello

(57) ABSTRACT

The invention includes systems and methods pertaining to Josephson effect devices. This includes electronic devices such as transistors known as Josephson Junction Field Effect Transistors (JJFETs). An electronic device is provided that has a source region including a superconductor material, a drain region including a superconductor material, a gate region between the source and drain regions, and a semiconductor region including an excitonic insulator material.

19 Claims, 3 Drawing Sheets

SYSTEM AND METHOD FOR ELECTRONIC DEVICES

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Data centers are specialized facilities housing large numbers of computer servers and related equipment for storing, processing, and managing large amounts of data. These facilities are used by businesses, governments, and other organizations to manage and store their digital data, such as customer data, financial records, and other types of digital assets. Data centers are designed to be highly secure and reliable, with redundant power supplies, cooling systems, and network connections to ensure uninterrupted operation.

The demand for data centers has increased significantly as the volume of digital data being generated by businesses and individuals has grown rapidly. With the increasing adoption of cloud or network computing and other digital technologies, there is increasing demand and energy consumption by data centers.

Use of superconducting computer systems has been proposed to lower energy usage associated with data centers and cloud computing. In one example, these systems have used rapid single flux quantum (RSFQ) circuits. While being advantageous in many respects, RSFQ circuits have a large static power dissipation that can be much larger than the dynamic power required by the RFSQ circuits to perform logic operations. This has limited RFSQ circuits from being widely deployed. What is desired are systems and methods for superconducting computer systems that improve upon these aspects.

SUMMARY

The following is a brief summary of subject matter that is described in greater detail herein. This summary is not intended to be limiting as to the scope of the claims.

Various embodiments described herein provide for systems and methods pertaining to Josephson effect devices. This includes, for example, electronic devices such as transistors known as Josephson Junction Field Effect Transistors (JJFETs). In one embodiment, an electronic device is provided having a source region including a superconductor material, a drain region including a superconductor material (which may be the same material or a different material when compared to the superconductor material of the source region), a gate region between the source and drain regions, and a semiconductor region including an excitonic insulator material.

In another embodiment, systems and methods pertaining to logic circuits are provided. For example, a circuit for Boolean logic operations can include source and drain regions having a superconductor material, a gate region between the source and drain regions, and a semiconductor region having an excitonic insulator material. This includes, for example, AND, OR, NOT, etc., logic functions and combinations thereof.

In yet another embodiment, systems and methods pertaining to Josephson effect devices are provided. For example, a method can include forming a superconductor source region, forming a superconductor drain region, forming a gate region between the source and drain regions, and forming a semiconductor region having an excitonic insulator material.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
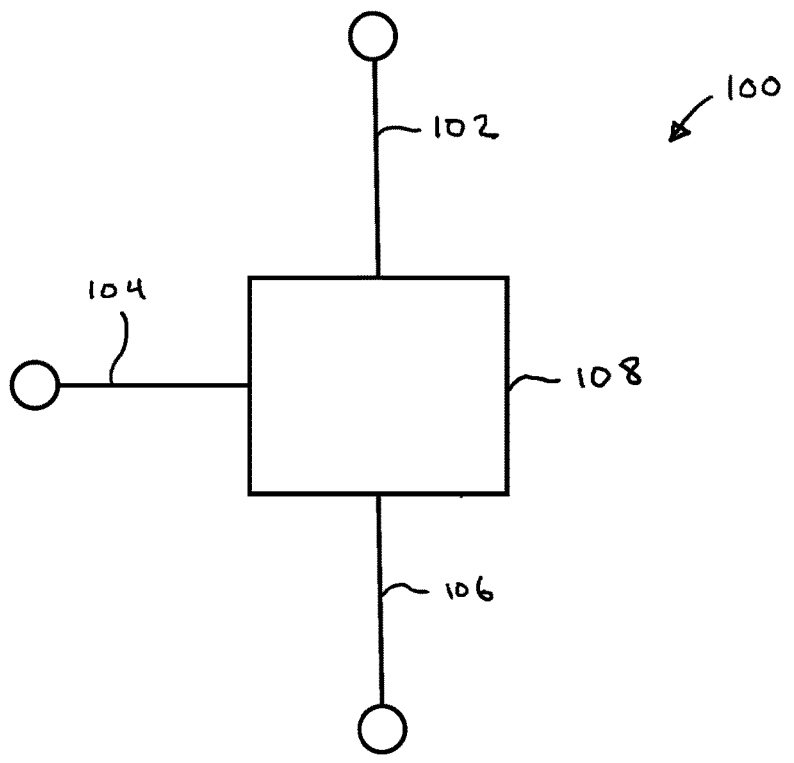
FIG. 1 is an exemplary embodiment of an electronic device suitable for digital circuits.

Various technologies pertaining to Josephson effect devices are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The systems and methods disclosed herein are an improvement over existing computer and/or datacenter systems that, for example, use superconducting technology. The systems and methods provide, for example, lower static power dissipation compared to RSFQ circuits. Further, due to the associated provision of superconducting transition temperatures of approximately 50K, the systems and methods allow for use of Josephson effect JFETs to be used for Boolean circuits.

The systems and methods use a semiconductor material such as, for example, excitonic insulators. Generally, an excitonic insulator is a material that can form tightly bound electron-hole pairs (i.e., excitons) when the electron(s) is excited from its low energy valance band to its higher energy conduction band. The resulting hole in the valence band remains tightly bound to the electron in the conduction band due to the Coulombic attraction between the electron and the hole. By virtue of this tight bounding, excitons have particle-like characteristics (e.g., mobility, etc.) that can provide the material with semiconductor qualities. Also, in the case of a Josephson effect JFET, use of an excitonic insulator as a semiconductor can lower the gate threshold voltage for the onset of conductance (e.g., to about 10 mV versus 0.1 V) and at usable superconducting transition temperatures (e.g., to about 50K versus+200K). This lowers the energy usage requirements for operation of Josephson effect JFETs and other field-effect transistor (FET) devices thus increasing their practical applicability to computer, data center, and other related technologies.

Turning now to FIG. 1, illustrated is an exemplary embodiment of an electronic device 100 suitable for digital (e.g., Boolean) circuits. In one example, electronic device 100 can be a field-effect transistor (FET). For instance, the electronic device 100 is a Josephson effect junction field-effect transistor (JJFET). In other embodiments, electronic device 100 may be a CMOS FET or similar type device. Electronic device 100 includes a source terminal 102, gate terminal 104, and drain terminal 106, all connected to a body 108. As will be described in more detail hereinafter, the body 108 includes a heterostructure having one or more regions/layers that include an excitonic insulator material. In operation, applying a threshold voltage to the gate terminal 104 creates a channel between source terminal 102 and drain terminal 106 that allows for conductivity. By varying the voltage on the gate terminal above the threshold voltage, the conductivity of the channel can be modulated, allowing for the amplification and/or switching of electrical signals. As mentioned above, use of an excitonic insulator material in the one or more semiconductor layers of body 108 has been found to lower the gate threshold voltage (e.g., to about 10 mV versus 0.1 V) for the onset of conductance between the source 102 and drain 106 in superconducting JJFETs.

Figure 2:
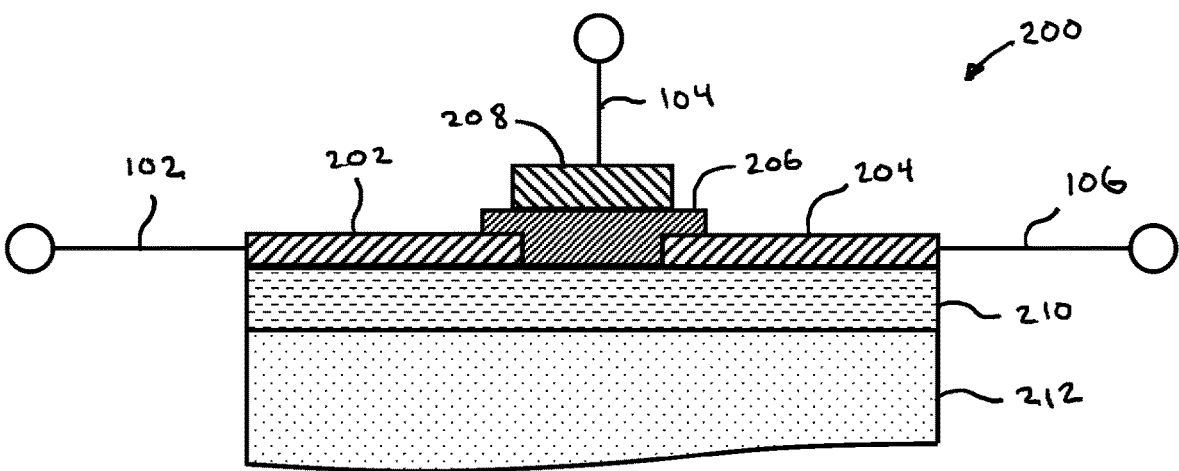
FIG. 2 is another exemplary embodiment of an electronic device suitable for digital circuits.

FIG. 2 is another exemplary embodiment of an electronic device 200 suitable for digital circuits. Device 200 includes a source region or layer 202 and a drain region or layer 204. In one embodiment, these regions or layers are made from a superconducting material such as, for example, high and/or low temperature superconductors. High temperature superconductors include, for example, LaSrCuO, YBCO (approx. 90K), MgB$_2$ (approx. 40K), and the like. Low temperature superconductors include, for example, aluminum (approx. 1.5K), niobium (approx. 4.5K) and the like. Superconducting materials are materials having the ability to conduct electricity with zero electrical resistance and near perfect efficiency without losing any energy as heat. Generally, below a certain critical temperature called the superconducting transition temperature, or Tc, superconducting materials exhibit these properties. Electronic devices employing such superconducting materials can include, for example, Josephson effect JFETs (JJFETs).

Between the source and drain regions or layers 202 and 204, a gate region having an oxide layer 206 is provided. The device 200 further includes a conductive gate contact terminal 208 that is in contact with the oxide layer 206. Oxide layer 206 is, for example, a thin layer of insulating material such as Al$_2$O$_3$, Hf$_2$O$_3$ or other similar material. The oxide layer acts as a barrier preventing current from flowing between the gate 104 and the conductance channel formed between the superconducting source 102 and superconducting drain 106, while allowing the gate 104 voltage to control the conductivity of the channel. The Josephson effect provides a supercurrent (in the form of Cooper pairs) that flows or tunnels through the excitonic insulator material region or layer 210 when a threshold voltage is applied to the gate 204.

A semiconductor region 210 having, for example, an excitonic insulator material, is provided in the body 108 of the device 200. The excitonic insulator material forms excitons (e.g., tightly bound electron-hole pairs that act like particles) when a critical voltage is applied. The excitons of the semiconductor region 210 and the Cooper pairs of the superconductors 202, 206 interact to form a conductance channel through the semiconductor layer 210. As will be described in more detail in the context of FIGS. 3 and 4, the use of an excitonic insulator material in semiconductor region 210 provides the JJFET with a lower conductance threshold voltage (e.g., approximately 10 mV versus 0.1 V) and thus requires a lower superconducting transition temperature (e.g., 50K versus+200K). A substrate base region 212 is also provided upon which to build the other regions. Base region 212 can be made of, for example, Silicon, GaSb, or other suitable materials.

Figure 3:
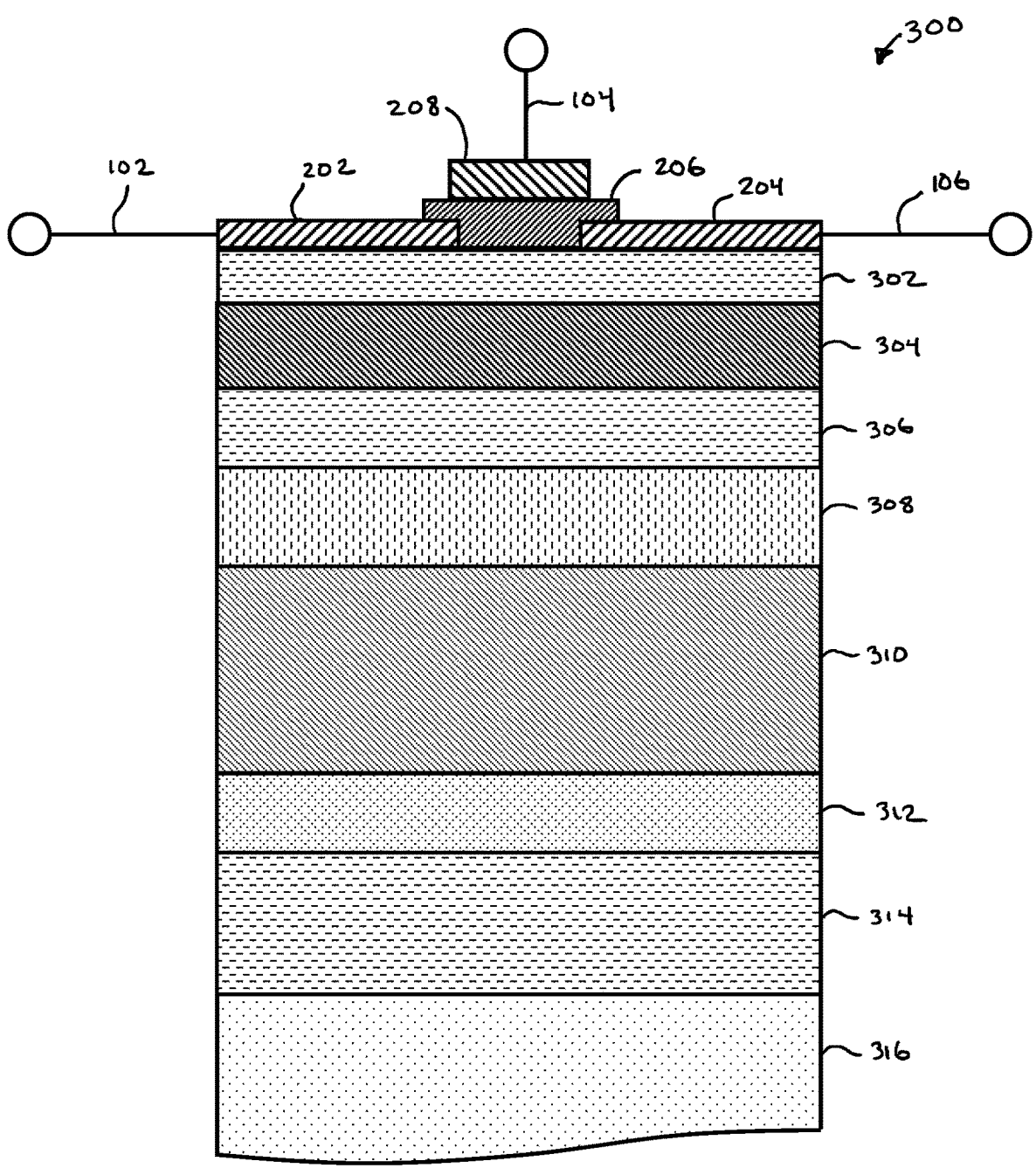
FIG. 3 is yet another exemplary embodiment of an electronic device suitable for digital circuits.

FIG. 3 depicts another exemplary embodiment of an electronic device 300 suitable for digital circuits. Device 300 includes a source region or layer 202, a drain region or layer 204, and a gate region having an oxide layer 206 as previously described. A heterostructure having the exciton insulator is provided proximate the superconducting source and drain regions or layers 202 and 204 and oxide region or layer 206. The structure includes a GaSb (2 nm) layer or an InAs (2 nm) layer 302, AlSb (10 nm) layer 304 (e.g., barrier layer), GaSb (5 nm) layer 306, InAs (10 nm) layer 308, AlGaSb (50 nm) layer 310 (e.g., barrier layer), a superlattice layer 312, GaSb (600 nm) layer 314, and GaSb substrate layer 316. In this embodiment, the quantum wells that realize the excitonic insulator are generated by layers 306 and 308 (e.g., type II GaSb/InAs) and the properties of the formed excitonic insulator can be adjusted by, for example, the layer thicknesses. In other embodiments, different excitonic insulator materials and layer thicknesses can be used such as, for example, those including other III-IV materials/compositions, TiSe$_2$, WTe$_2$, etc. Also, while representative layer thicknesses have been provided, these can be changed or tuned to adjust the device properties such as, for example, threshold voltages and conductance temperatures. In yet other embodiments, the heterostructure arrangement/layers can be modified so long as an exciton insulator is provided proximate the superconductor regions.

Figure 4:
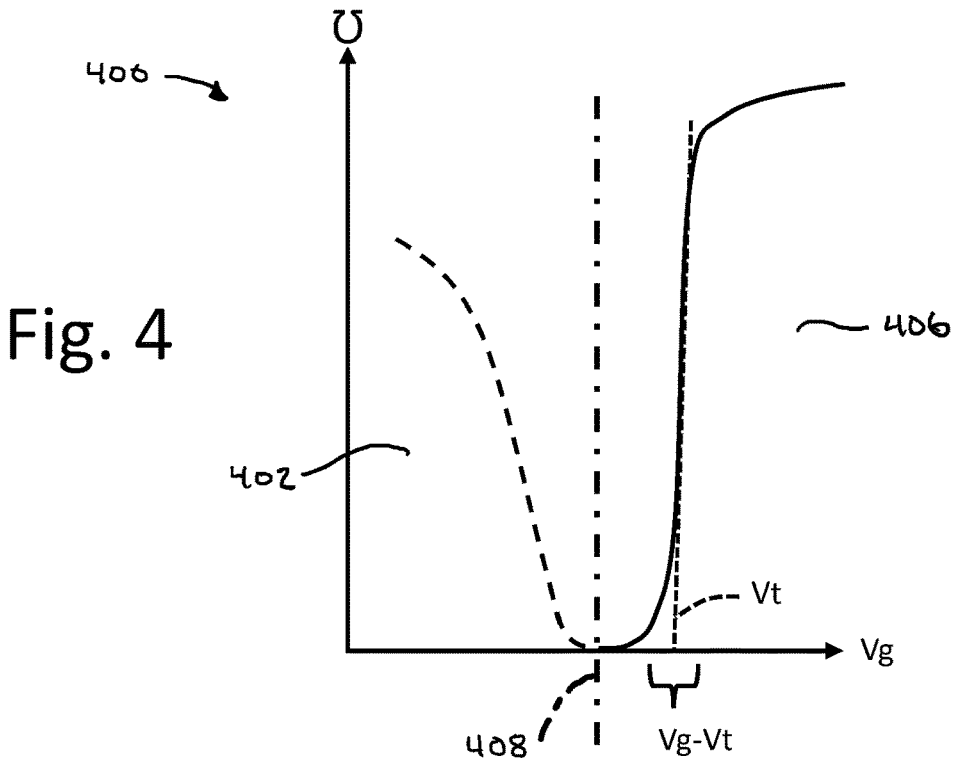
FIG. 4 is an exemplary embodiment of a graph showing conductance of an electronic device disclosed herein.

Referring now to FIG. 4, a graph 400 showing conductance of an electronic device disclosed herein is provided. In FIG. 4, the x-axis represents gate voltage $v_g$ and the y-axis represents conductance $\mho$ between the source and drain regions or layers. Region 402 represents the hole state and region 406 represents the electron state and the boundary, an excitonic insulator, is represented at 408. For the excitonic insulator-based device(s) disclosed herein, a high amount of conductance is obtained in a relatively small region ($v_g-v_t$) of the gate voltage. In certain embodiments, this conductance is obtained at lower gate voltages (e.g., 10 mV versus 0.1 V) compared to non-excitonic insulator-based devices/JJFETs. Additionally, by having lower gate threshold voltages $v_t$, superconductors having lower threshold transition temperatures for superconducting can be used (e.g., 50K versus+200K) to achieve the superconducting electronic device. In embodiments where the gate voltage is less than approximately 10 mV, the previously mentioned low temperature superconductors can be used in the source and drain regions. In embodiments where the gate voltage is approximately 10 mV or higher, the previously mentioned high temperature superconducts can be used in the source and drain regions.

Figure 5:
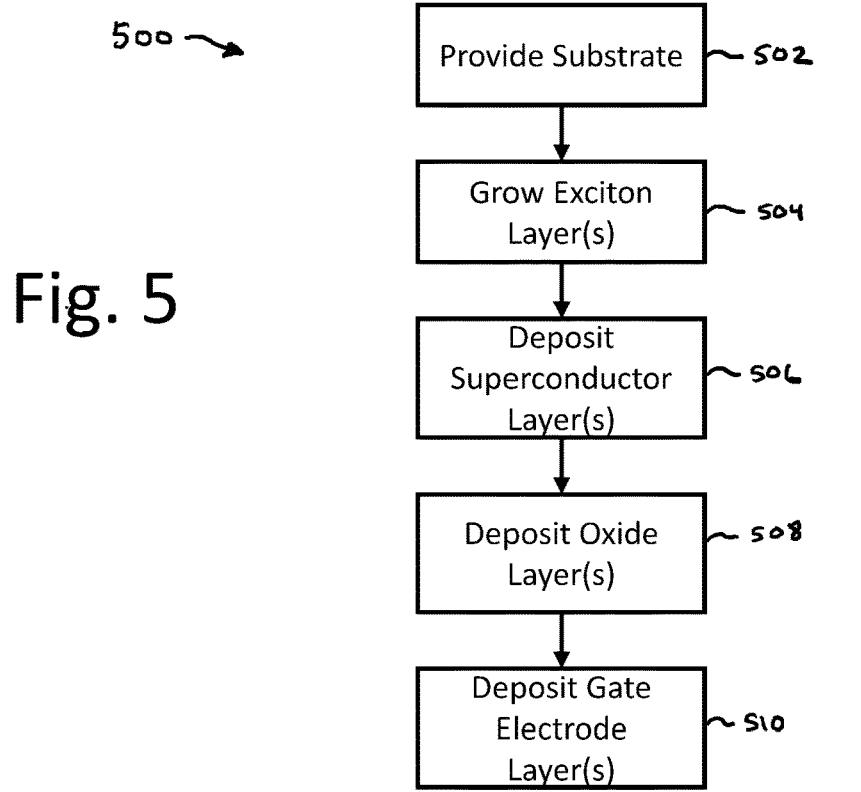
FIG. 5 is a flow diagram that illustrates an exemplary methodology for forming an electronic device suitable for digital circuits.

FIG. 5 is a flow diagram illustrating an exemplary methodology 500 for forming an electronic device suitable for digital circuits. In 502, a substrate is provided such as, for example, GaSb or similar material. In 504, the heterostructure having one or more excitonic insulator layers is grown or provided. This can include one or more of layers 302-314 shown in FIG. 3. These layers can be deposited or grown by, for example, molecular beam epitaxy (MBE). In 506, the superconductor regions or layers are grown or deposited. This can include, for example, the source and drain superconductor regions or layers 202 and 204 in FIG. 2. These regions or layers can be grown or deposited by, for example, sputter, e-beam evaporator, or other thin film deposition techniques. In 508, the oxide region or layers are grown or deposited. This can include, for example, the oxide region or layer 206 in FIGS. 2 and 3. The oxide region or layer can be grown or deposited by Atomic Layer Deposition (ALD). In 510, the gate electrode region or layer is grown or deposited. This can include, for example, the gate electrode region or layer 208 in FIGS. 2 and 3. The gate electrode region or layer can be grown or deposited by e-beam evaporator. While certain technologies for growing or depositing the various regions or layers has been described by way of example, it should be noted that other techniques suitable for such region/layer growth can also be used. Further, it should be noted that the described process order is exemplary and that different orders may be used.

Further, while the disclosed examples illustrate a single electronic device, combinations of devices can be fabricated on wafters and/or to form logic circuits such as Boolean circuits. For example, combinations of JJFET devices can be used to form logic circuits such as, for example, inverter gates, AND gates, OR gates, NAND gates, NOR gates, etc. These components are the building blocks of much more complex circuits such as, for example, microprocessors, memories, and other components of modern computer and data storage systems.

Various aspects pertaining to Josephson effect devices are described herein in accordance with at least the following examples.

(A1) In an aspect, an electronic device includes a source region comprising a first superconductor material. The electronic device also includes a drain region comprising a second superconductor material. The electronic device further includes a gate region between the source and drain regions and comprising an oxide material and a metallic gate contact. The electronic device additionally includes a semiconductor region in contact with the source region, the drain region, and the gate region, where the semiconductor material includes an excitonic insulator material.

(A2) In some embodiments of the electronic device of (A1), the excitonic insulator material includes InAs material.

(A3) In some embodiments of the electronic device of at least one of (A1)-(A2), the excitonic insulator material comprises GaSb material.

(A4) In some embodiments of the electronic device of at least one of (A1)-(A3), the excitonic insulator material comprises a type II InAs/GaSb material.

(A5) In some embodiments of the electronic device of at least one of (A1)-(A4), a difference between a gate region bias voltage and a threshold voltage for conductance between the source and drain regions is approximately 10 mV or less.

(A6) In some embodiments of the electronic device of at least one of (A1)-(A5), the electronic device has a superconducting transition temperature of approximately 50K or less.

(A7) In some embodiments of the electronic device of at least one of (A1)-(A6), the first superconductor material comprises at least one of LaSrCuO, YBCO, or $MgB_2$.

(A8) In some embodiments of the electronic device of at least one of (A1)-(A7), the second superconductor material comprises at least one of LaSrCuO, YBCO, or $MgB_2$.

(A9) In some embodiments of the electronic device of at least one of (A1)-(A8), the oxide material comprises at least one of $Al_2O_3$ or $Hf_2O_3$.

(B1) In another aspect, an electronic device includes a Boolean circuit, where the Boolean circuit includes a source region formed of a superconductor material. The Boolean circuit also includes a drain region formed of the superconductor material. The Boolean circuit further includes a gate region between the source region and drain region, the gate region formed of an oxide material and a metallic gate contact. The Boolean circuit additionally includes a semiconductor region formed of an excitonic insulator material, the semiconductor region in contact with the source region, the drain region, and the gate region.

(B2) In some embodiments of the electronic device of (B1), the excitonic insulator material comprises InAs material.

(B3) In some embodiments of the electronic device of at least (B1)-(B2), wherein the excitonic insulator material comprises GaSb material.

(B4) In some embodiments of the electronic device of at least (B1)-(B3), the excitonic insulator material comprises a type II InAs/GaSb material.

(B5) In some embodiments of the electronic device of at least (B1)-(B4), a difference between a gate region bias voltage and a threshold voltage for conductance between the source and drain regions is approximately 10 mV or less.

(B6) In some embodiments of the electronic device of at least (B1)-(B5), the electronic device has a superconducting transition temperature of approximately 50K or less.

(C1) In yet another aspect, use of any of the electronic devices (e.g., any of (A1)-(A9) or (B1)-(B9)) is disclosed herein.

(D1) In still yet another aspect, a method for forming an electronic device includes forming a superconductor source region. The method also includes forming a superconductor drain region. The method further includes forming an oxide gate region between the source and drain regions. The method additionally includes forming semiconductor region having an excitonic insulator material, the semiconductor region being in contact with the superconductor source region, the superconductor drain region, and the oxide gate region.

(D2) In some embodiments of the method of (D1), the method also includes applying an approximate voltage of 10 mV or less to the gate region.

(D3) In some embodiments of the method of (D1), the method also includes applying an approximate voltage of 10 mV or less to the gate region to cause conductance between the superconducting source region and the superconducting drain region.

(D4) In some embodiments of the method of at least one of (D1)-(D3), the method also includes applying a superconducting transition temperature of approximately 50K or less.

(D5) In some embodiments of the method of at least one of (D1)-(D4), forming the semiconductor region having an exciton insulator material comprises depositing a type II InAs/GaSb material.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An electronic device, comprising:
a source region comprising a first superconductor material;
a drain region comprising a second superconductor material;
a gate region between the source and drain regions and comprising an oxide material and a metallic gate contact; and
a semiconductor region in contact with the source region, the drain region, and the gate region, wherein the semiconductor region comprises a heterostructure comprising:
a first barrier layer;
a second barrier layer; and
an excitonic insulator between the first barrier layer and the second barrier layer, wherein the excitonic insulator comprises:
an InAs layer; and
a GaSb layer.

2. The device of claim 1 wherein the device is configured to transition between a high conductance state and a low conductance state between the source region and the drain region as a function of a difference between a gate region bias voltage and a threshold voltage which is approximately 10 mV or less.

3. The device of claim 1 having a superconducting transition temperature of approximately 50K or less.

4. The device of claim 1 wherein the first superconductor material comprises at least one of LaSrCuO, YBCO, or $MgB_2$.

5. The device of claim 1 wherein the second superconductor material comprises at least one of LaSrCuO, YBCO, or $MgB_2$.

6. The device of claim 1 wherein the oxide material comprises at least one of $Al_2O_3$ or $Hf_2O_3$.

7. The device of claim 1 wherein:
the InAs layer has a thickness of approximately 10 nm; and
the GaSb layer has a thickness of approximately 5 nm.

8. The device of claim 1 wherein properties of the excitonic insulator are a function of material types of the InAs layer and the GaSb layer and thicknesses of the InAs layer and the GaSb layer.

9. The device of claim 1 wherein:
the first barrier layer comprises an AlSb layer; and
the second barrier layer comprises an AlGaSb layer.

10. An electronic device, comprising:
a Boolean circuit having:
a source region formed of a superconductor material;
a drain region formed of the superconductor material;
a gate region between the source region and drain region, the gate region formed of an oxide material and a metallic gate contact; and
a semiconductor region in contact with the source region, the drain region, and the gate region, wherein the semiconductor region comprises a heterostructure comprising:
a first barrier layer;
a second barrier layer; and
an excitonic insulator between the first barrier layer and the second barrier layer, wherein the excitonic insulator comprises:
an InAs layer; and
a GaSb layer.

11. The device of claim 10 wherein the device is configured to transition between a high conductance state and a low conductance state between the source region and the drain region as a function of a difference between a gate region bias voltage and a threshold voltage which is approximately 10 mV or less.

12. The device of claim 10 having a superconducting transition temperature of approximately 50K or less.

13. The device of claim 10 wherein:
the InAs layer has a thickness of approximately 10 nm; and
the GaSb layer has a thickness of approximately 5 nm.

14. The device of claim 10 wherein properties of the excitonic insulator are a function of thicknesses of the InAs layer and the GaSb layer.

15. The device of claim 10 wherein:
the first barrier layer comprises an AlSb layer; and
the second barrier layer comprises an AlGaSb layer.

16. A method comprising:
forming a superconductor source region;
forming a superconductor drain region;
forming an oxide gate region between the source and drain regions; and
forming semiconductor region in contact with the superconductor source region, the superconductor drain region, and the oxide gate region, wherein the semiconductor region comprises a heterostructure comprising:
a first barrier layer;
a second barrier layer; and
an excitonic insulator between the first barrier layer and the second barrier layer, wherein the excitonic insulator comprises:
an InAs layer; and
a GaSb layer.

17. The method of claim 16 further comprising applying an approximate voltage of 10 mV or less to the gate region to cause a change in conductance between the superconducting source region and the superconducting drain region.

18. The method of claim 16 further comprising applying a superconducting transition temperature of approximately 50K or less.

19. The method of claim 16 wherein forming the exciton insulator of the semiconductor region comprises:
depositing the InAs layer having a thickness of approximately 10 nm; and depositing the GaSb layer having a thickness of approximately 5 nm.

\* \* \* \* \*